United States Patent [19]
Choi

[11] Patent Number: 5,844,447
[45] Date of Patent: Dec. 1, 1998

[54] OSCILLATOR DEVICE GENERATING SIGNALS OF DIFFERENT CYCLES

[75] Inventor: Jae Myoung Choi, Ichon, Rep. of Korea

[73] Assignee: Hyundai Electronics Industries Co., Ltd., Ichon, Rep. of Korea

[21] Appl. No.: 885,834

[22] Filed: Jun. 30, 1997

[30] Foreign Application Priority Data

Jun. 29, 1996 [KR] Rep. of Korea ........................ 96-25751

[51] Int. Cl.$^6$ ................................................. H03K 3/353
[52] U.S. Cl. .................................. 331/57; 331/46; 331/49
[58] Field of Search ................................. 331/57, 46, 49, 331/50, 175; 327/161, 162, 175

[56] References Cited

U.S. PATENT DOCUMENTS

| | | | |
|---|---|---|---|
| 3,740,660 | 6/1973 | Davies, Jr. ................................. | 331/45 |
| 5,446,418 | 8/1995 | Hara et al. ................................. | 331/57 |

*Primary Examiner*—Steven Mottola
*Assistant Examiner*—Arnold Kinkead
*Attorney, Agent, or Firm*—Thelen Reid & Priest LLP

[57] ABSTRACT

An oscillating device is disclosed including a first ring oscillator having at least three odd inverters connected in series, an input terminal of the first of the inverters being connected with an output terminal of the last of the inverters, and applying an output signal of the last inverter to a first buffer's input terminal, thus producing a signal of the first cycle; the first buffer connected with the output terminal of the first ring oscillator's last inverter, having at least two even inverters connected in series, and buffering an output signal of the last inverter to produce it to outside; a second ring oscillator having at least three odd delay devices connected in series, wherein a power supply of each delay device is connected with the output terminal of each of the first ring oscillator's corresponding inverters, and an output terminal of the last of the delay devices is connected with an input terminal of the first of the delay devices, thus producing a signal of the second cycle, larger than the first cycle, to an input terminal of a second buffer; and the second buffer connected with the output terminal of the second ring oscillator's last delay device, having at least two even inverters connected in series, and buffering an output signal of the last delay device.

19 Claims, 10 Drawing Sheets

OSCILLATOR DEVICE GENERATING SIGNALS OF DIFFERENT CYCLES

BACKGROUND OF THE INVENTION

1. Field of the Invention

The present invention relates to an oscillating device. More particularly, the present invention relates to an oscillating device which generates signals of different cycle.

2. Discussion of Related Art

Figure 1:
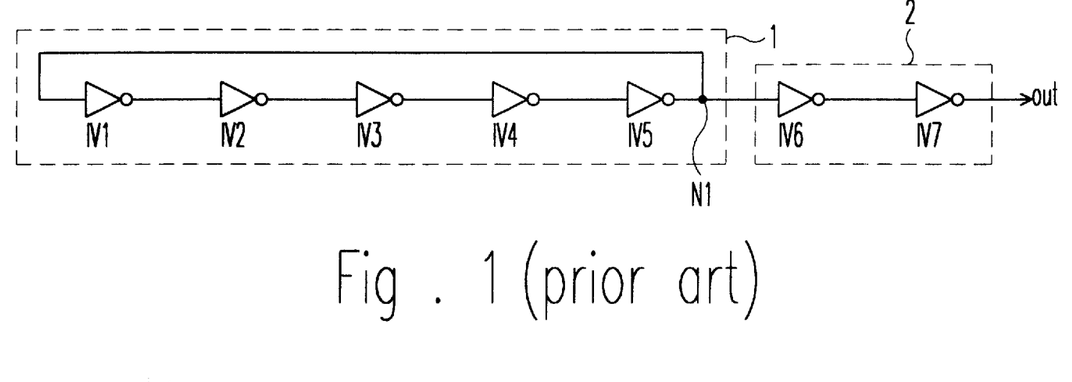
FIG. 1 is a circuit diagram of a conventional oscillator.

FIG. 1 shows a circuit diagram of a conventional oscillator. The conventional oscillator includes 1st, 2nd, 3rd, 4th and 5th inverters IV1, IV2, IV3, IV4 and IV5 connected in series, a feedback line connecting 5th inverter IV5's output terminal with 1st inverter IV1's input terminal, and 6th and 7th inverters IV6 and IV7 connected in series with 5th inverter IV5's output terminal and buffering 5th inverter IV5's output signal, thus producing it to an output terminal. Therefore, the oscillator produces waveforms of constant cycle all the time. Thus, when output signals of different cycle are necessary, another oscillator must be added to the conventional oscillator, which increases the chip size and power consumption.

SUMMARY OF THE INVENTION

Accordingly, the present invention is directed to an oscillating device that substantially obviates one or more of the problems due to limitations and disadvantages of the related art.

It is an object of the present invention to provide an oscillating device which is realized as a conventional oscillator and another oscillator using output potential of each inverter constituting the conventional oscillator, thereby generating signals of different cycle.

Additional features and advantages of the invention will be set forth in the description which follows, and in part will be apparent from the description, or may be learned by practice of the invention. The objectives and other advantages of the invention will be realized and attained by the structure specifically indicated in the written description and the claims hereof, as well as the appended drawings.

To achieve these and other advantages and in accordance with the purpose of the present invention, as embodied and broadly described, an oscillating device is disclosed and includes a first ring oscillator having at least three odd inverters connected in series, an input terminal of the first of the inverters being connected with an output terminal of the last of the inverters, and applying an output signal of the last inverter to a first buffer's input terminal, thus producing a signal of first cycle; the first buffer connected with the output terminal of the first ring oscillator's last inverter, having at least two even inverters connected in series, and buffering an output signal of the last inverter to produce it to outside; a second ring oscillator having at least three odd delay connected in series, wherein a power supply of each delay is connected with the output terminal of each of the first ring oscillator's corresponding inverters, and an output terminal of the last one of the delay is connected with an input terminal of the first one of the delay, thus producing a signal of second cycle, larger than the first cycle, to an input terminal of a second buffer; and the second buffer connected with the output terminal of the second ring oscillator's last delay, having at least two even inverters connected in series, and buffering an output signal of the last delay to produce it to outside.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the drawings.

In the drawings.

DETAILED DESCRIPTION OF PREFERRED EMBODIMENT

Reference will now be made in detail to the preferred embodiments of the present invention, examples of which are illustrated in the accompanying drawings.

Figure 2:
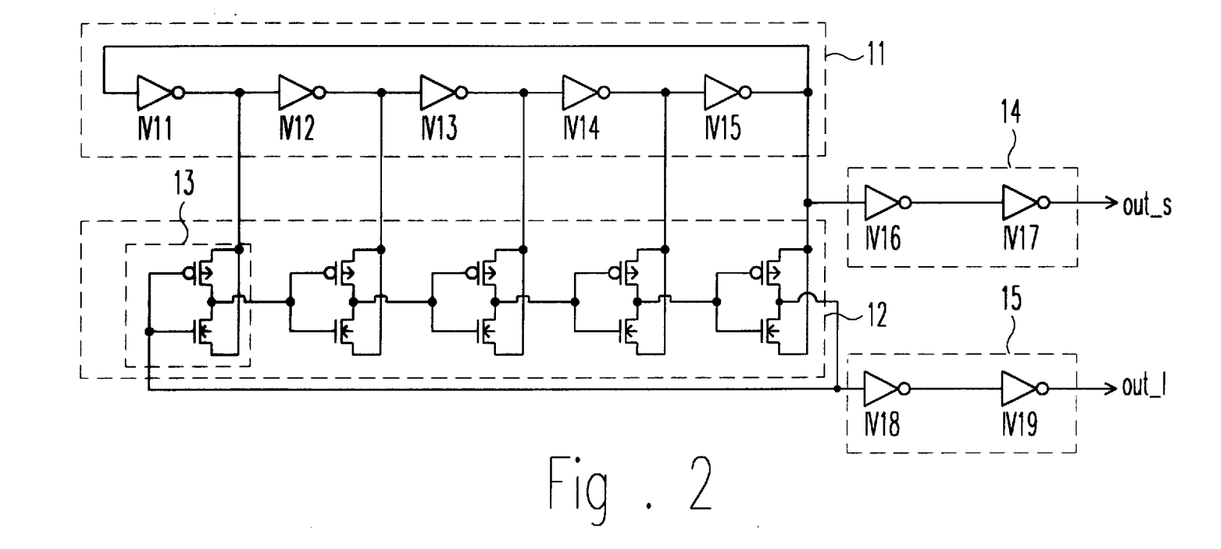
FIG. 2 is a circuit diagram of an oscillating device in accordance with a first preferred embodiment of the present invention.

FIG. 2 is a circuit diagram of an oscillating device in accordance with a first preferred embodiment of the present invention.

The oscillating device includes a first ring oscillator 11 having 11th, 12th, 13th, 14th, and 15th inverters IV11, IV12, IV13, IV14 and IV15 connected in series, and a feedback line connecting 15th inverter IV15's output terminal with 11th inverter IV11's input terminal; and a second ring oscillator 12 having five delays 13.

Each delay consists of a PMOS transistor and an NMOS transistor. The PMOS transistor has a drain terminal connected to the NMOS transistor's drain terminal and then connected with a common gate terminal of the next PMOS and NMOS transistors, a source terminal connected to the NMOS transistor's source terminal and then connected with each inverter's output terminal, and a gate terminal connected with the NMOS transistor's gate terminals thus receiving an output signal of the preceding delay, the last delay's output terminal being connected to the first common gate terminal.

The oscillating device also includes a first buffer 14 having 16th and 17th inverters IV16 and IV17 connected to each other in series, and a second buffer 15 having 18th and 19th inverters IV18 and IV19 connected to each other in series. First buffer 14 is connected with the output terminal of 15th inverter IV15 of first ring oscillator 11, and buffers 15th inverter IV15's output signal, and then produces it's output signal as a first output terminal Out-s. Second buffer 15 is connected with the output terminal of the last delay of second ring oscillator 12, and buffers an output signal, produced through the node, thereby outputting it to a second output terminal Out-l.

The following description relates to the operation of the oscillating device in accordance with the first preferred embodiment.

First output terminal Out-s produces a waveform with short cycle which is similar to the conventional one, and second output terminal Out-l generates a waveform with a cycle longer than that of the waveform generated from first output terminal Out-s. That is, the oscillating device of the first preferred embodiment produces waveforms of different cycles, which result from the size ratio of the inverters and MOS transistors. One cycle time of an output signal of second ring oscillator 12 is designed to be longer than first ring oscillator 11's by making the turn-on size of the respective MOS transistors small relatively.

More specifically, if a low-level signal is produced from 15th inverter IV15's output terminal and a high-level signal is output from the last delay's output terminal, the low-level signal and the high-level signal are respectively inputted to 11th inverter IV11 and the common gate terminal of the first delay. Signals produced from 11th inverter IV11's output terminal, 12th inverter IV12's output terminal, 13th inverter IV13's output terminal, 14th inverter IV14's output terminal, and 15th inverter IV15's output terminal attain high, low, high, low, and high levels, respectively. One cycle of first ring oscillator's output signal is shorter than that of second ring oscillator's, and its pulse width becomes relatively small.

In each delay that uses the respective output terminals of the above inverters as its power supply, a high-level signal is applied to the first delay's common gate terminal to turn on its NMOS transistor, and a high-level signal from 11th inverter IV11's output terminal is applied to the next stage's common gate terminal through the above NMOS transistor. Since the turn-on size of the NMOS transistor is very small, even if 11th inverter IV11's output terminal attains a high level, the output signal from the first delay's output terminal is not converted into a high-level one rapidly but remains at a low level.

Consequently, an output signal from the first delay's output terminal is at a low level to thereby turn on the next delay's PMOS transistor, and 12th inverter's output signal is transmitted through the PMOS transistor. At this point, similarly, the PMOS transistor's turn-on size is very small, so its output still remains low, even though its output voltage becomes higher than the first delay's output voltage.

Provided that a signal produced from the last output terminal of second ring oscillator 12 attains a high level, a voltage that is inputted to the common gate terminal of the last delay, is recognized as a high-level voltage and corresponds to several cycles of first ring oscillator 11's output in order to convert the high-level signal into a low-level signal. In other words, output signals of second ring oscillator 12 are of low frequency and of large pulse width while signals produced by first ring oscillator 11 are of high frequency.

Figure 11:
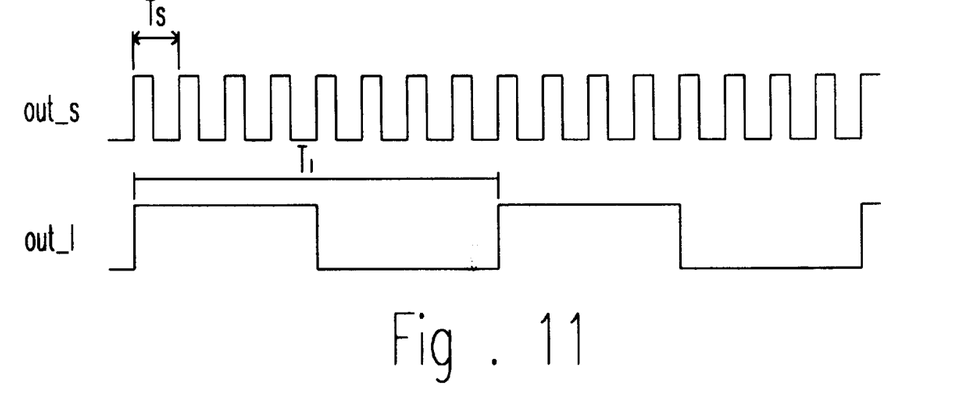
FIG. 11 is a timing diagram of output signals of different cycle produced from the oscillating device in accordance with the first preferred embodiment.

FIG. 11 is a timing diagram of output signals each produced from first output terminal Out-s and second output terminal Out-l in accordance with the first preferred embodiment. The waveform output from first output terminal Out-s has a cycle different from that of the waveform from second output terminal Out-l.

Figure 3:
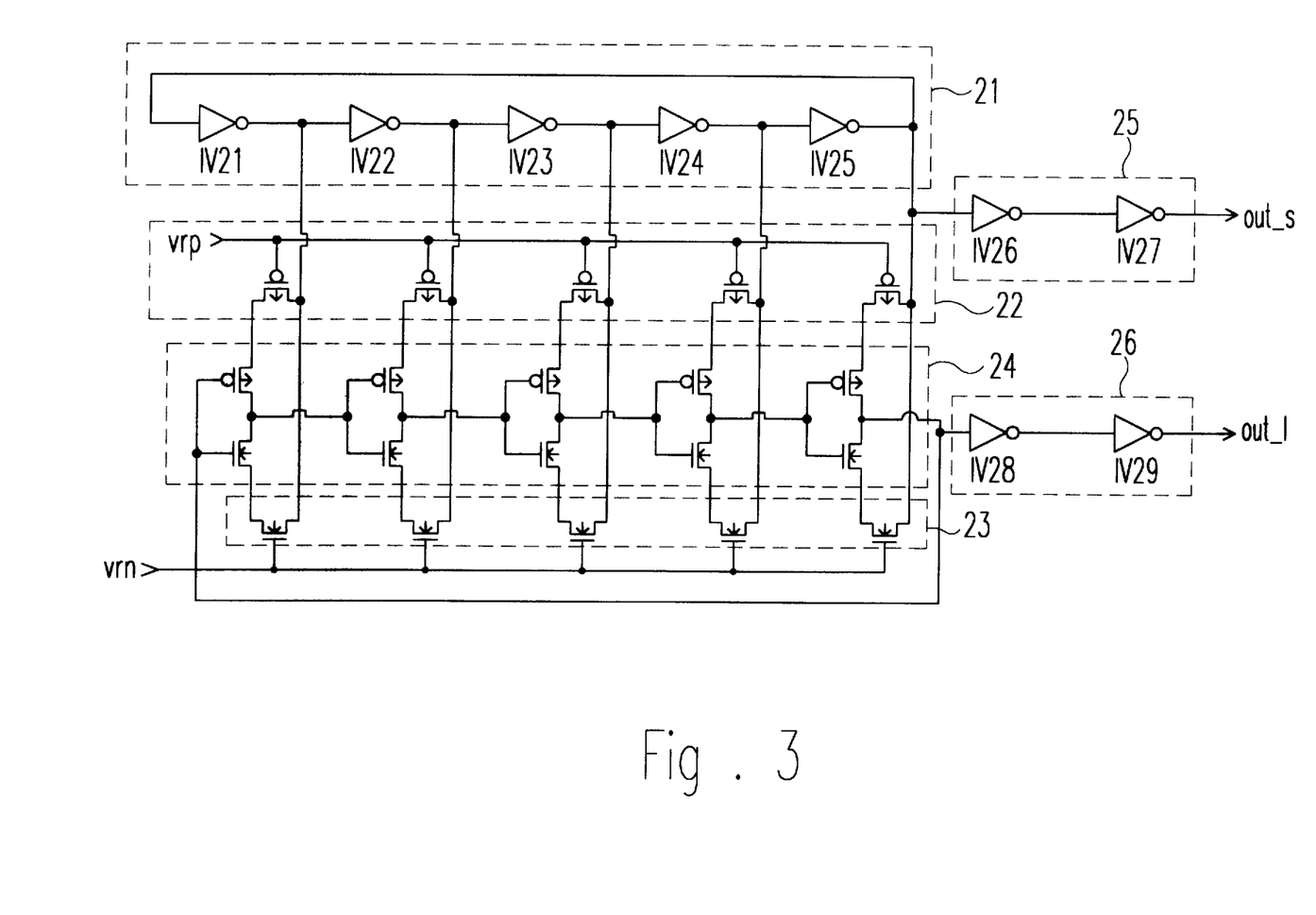
FIG. 3 is a circuit diagram of an oscillating device wherein reference potentials are added to the first preferred embodiment of the present invention.

FIG. 3 is a circuit diagram of an oscillating device wherein reference potentials are added to the first preferred embodiment of the present invention. What differs from the first preferred embodiment is that the oscillating device of the second preferred embodiment generates a waveform with a constant pulse width that does not vary with voltage and temperature. The oscillating device of the first preferred embodiment produces an output signal whose pulse width may vary with voltage and temperature. Thus, first and second voltage/temperature controllers 22 and 23 are additionally included in the oscillating device of the second preferred embodiment to obtain an output waveform that does not vary with voltage and temperature.

The oscillating device has basically the same construction as that of the first preferred embodiment, except the following. The first voltage/temperature controller 22 is connected between each source terminal of a second ring oscillator 24's PMOS transistors and each output terminal of a first ring oscillator 21's inverters, and PMOS reference potential vrp is applied to each gate terminal of first voltage/temperature 22's transistors. Second voltage/temperature controller 23 is connected between each source terminal of second ring oscillator 24's NMOS transistors and each output terminal of first ring oscillator 21's inverters, and NMOS reference potential vrn is applied to each gate terminal of second voltage/temperature 23's transistors.

The operation of the oscillating device of the second preferred embodiment is the same as that of the first preferred embodiment, and thus a detailed description thereabout will be omitted.

Figure 4:
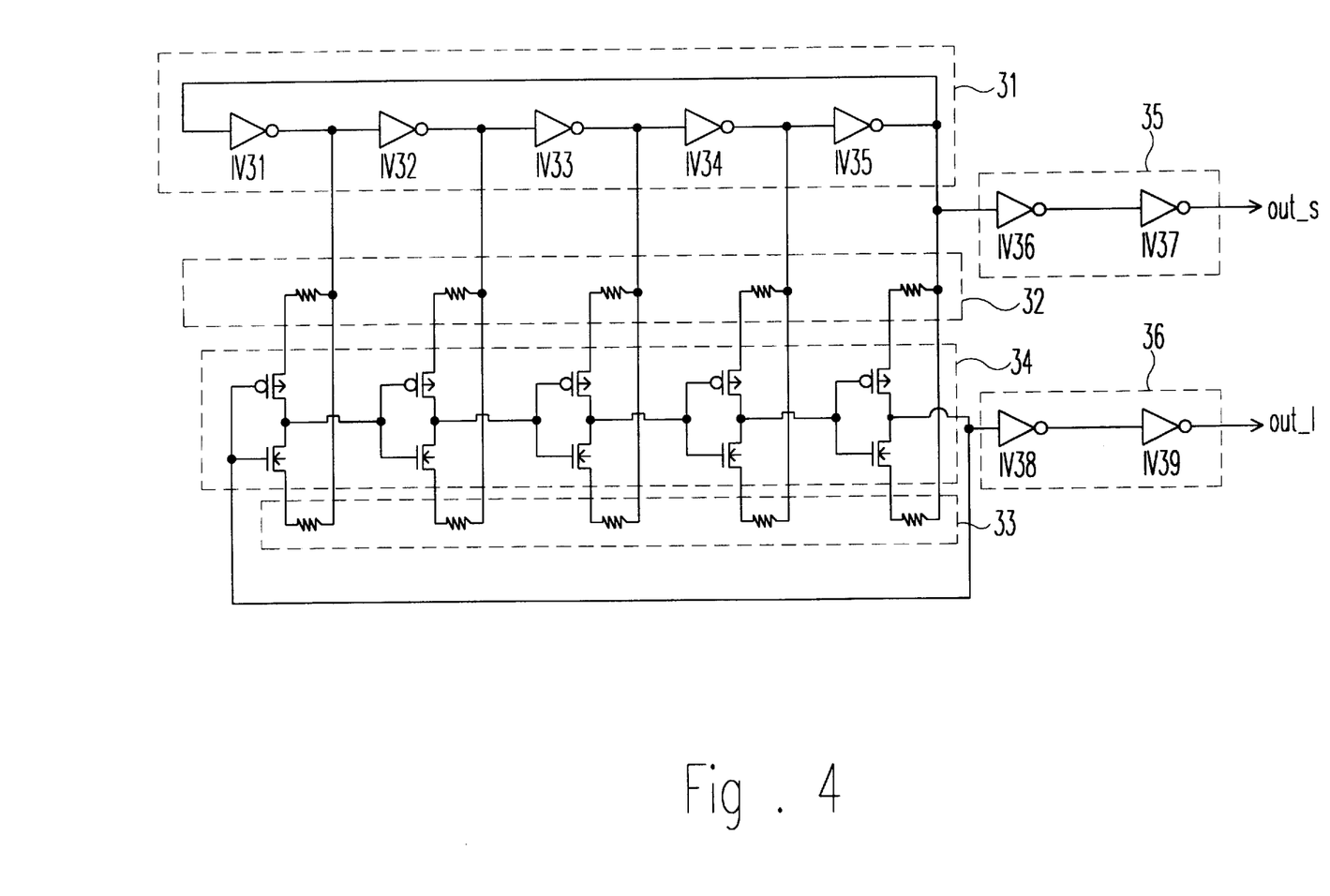
FIG. 4 is a circuit diagram of an oscillating device wherein resistors are added to the first preferred embodiment of the present invention.

FIG. 4 is a circuit diagram of an oscillating device wherein resistors are added to the first preferred embodiment of the present invention.

The construction of this oscillating device is the same as that of the second preferred embodiment, except that first and second temperature controllers 32 and 33, each having resistors that are not influenced by the ambient temperature, are connected instead of first and second voltage/temperature controllers 22 and 23. The operation of such an oscillating device is the same as that of the first preferred embodiment, and thus a detailed description thereabout will be omitted.

Figure 5:
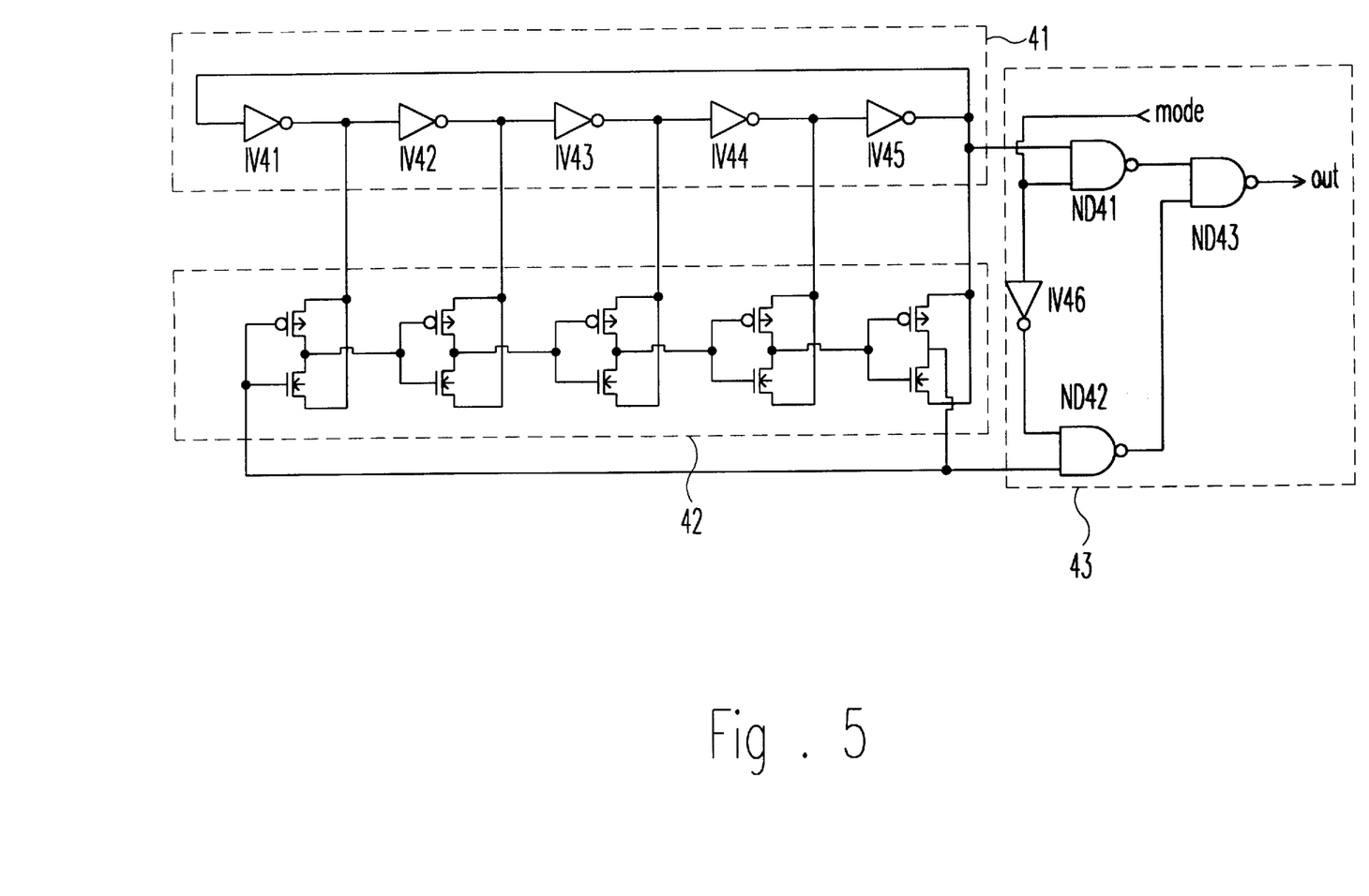
FIG. 5 is a circuit diagram of an oscillating device in accordance with a second preferred embodiment of the present invention.

FIG. 5 is a circuit diagram of an oscillating device in accordance with a second preferred embodiment of the present invention. A first ring oscillator 41 and a second ring oscillator 42 are the same as those of the first preferred embodiments in construction, so only a mode cycle controller 43 will be described in detail.

Mode cycle controller 43 includes a 41st NAND gate ND41 which performs a NAND operation with respect to an output signal and a mode signal of first ring oscillator 41 and produces a resultant output to an input terminal of a 43rd NAND gate ND43; a 42nd NAND gate ND42 that performs a NAND operation with respect to the mode signal inverted by a 46th inverter IV46 and an output signal of second ring oscillator 42 and produces a resultant output to the other input terminal of 43rd NAND gate ND 43; 43rd NAND gate ND 43 which performs a NAND operation with respect to the output signal of 41st NAND gate ND41 and the output signal of 42nd NAND gate ND42 and produces a combination of the output signals of first and second ring oscillators 41 and 42 to an output terminal Out.

The following description concerns the operation of the oscillating device in accordance with the second preferred embodiment.

The waveform, produced from first output terminal Out-s as depicted in FIG. 11, is outputted from first ring oscillator 41's output terminal, and the waveform, generated from second output terminal Out-l as shown in FIG. 11, is outputted from second ring oscillator 42's output terminal so that one waveform, into which the two waveforms are combined by mode cycle controller 43, is produced to output terminal Out.

Figure 12:
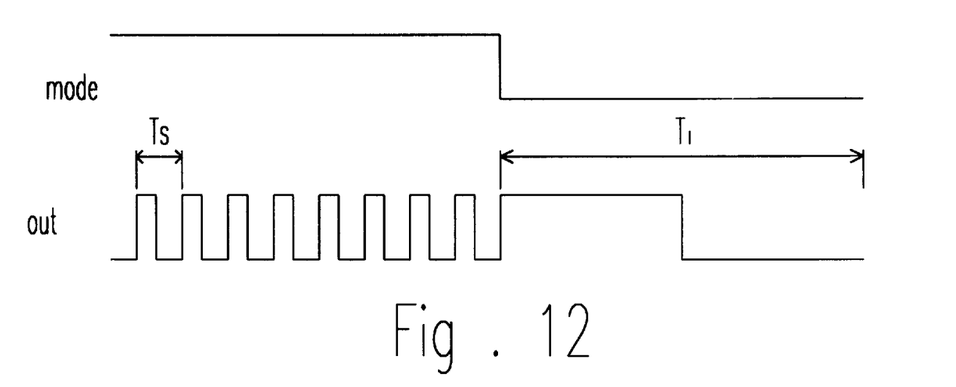
FIG. 12 is a timing diagram of an output signal having different according to a mode, produced from the oscillating device in accordance with the second preferred embodiment.

When the mode signal attains a high level, high-level signals are produced from 42nd NAND gate ND42's output terminal all the time, regardless of second ring oscillator 42's output signal, and an inverted output of first ring oscillator 41's output signal is produced from 41st NAND gate ND41's output terminal. 43rd NAND gate ND43 performs a NAND operation with respect to the inverted output and 42nd NAND gate ND42's output signal, i.e. high-level signal, so that first ring oscillator 41's output signal is produced from output terminal Out. That is, in the case that the mode signal is at a high level, the output signal of first ring oscillator 41 having a small pulse width, as shown in FIG. 12, is generated from output terminal Out.

When the mode signal attains a low level, high-level signals are produced from 41st NAND gate ND41's output terminal all the time, and an inverted output of the high-level mode signal, inverted by 46th inverter IV46, and second ring oscillator 42's output signal are inputted to 42nd NAND gate ND42. Therefore, an inverted output of second ring oscillator 42's output signal is produced from the output terminal of 42nd NAND 42ND, and second ring oscillator 42's output signal is generated from output terminal Out through 43rd NAND gate ND43. When the mode signal is at a low level, the output signal of second ring oscillator 42 having a large pulse width, as shown in FIG. 12, is generated from output terminal Out.

The oscillating device of the second preferred embodiment generates output signals of the same waveform and different cycles.

Figure 6:
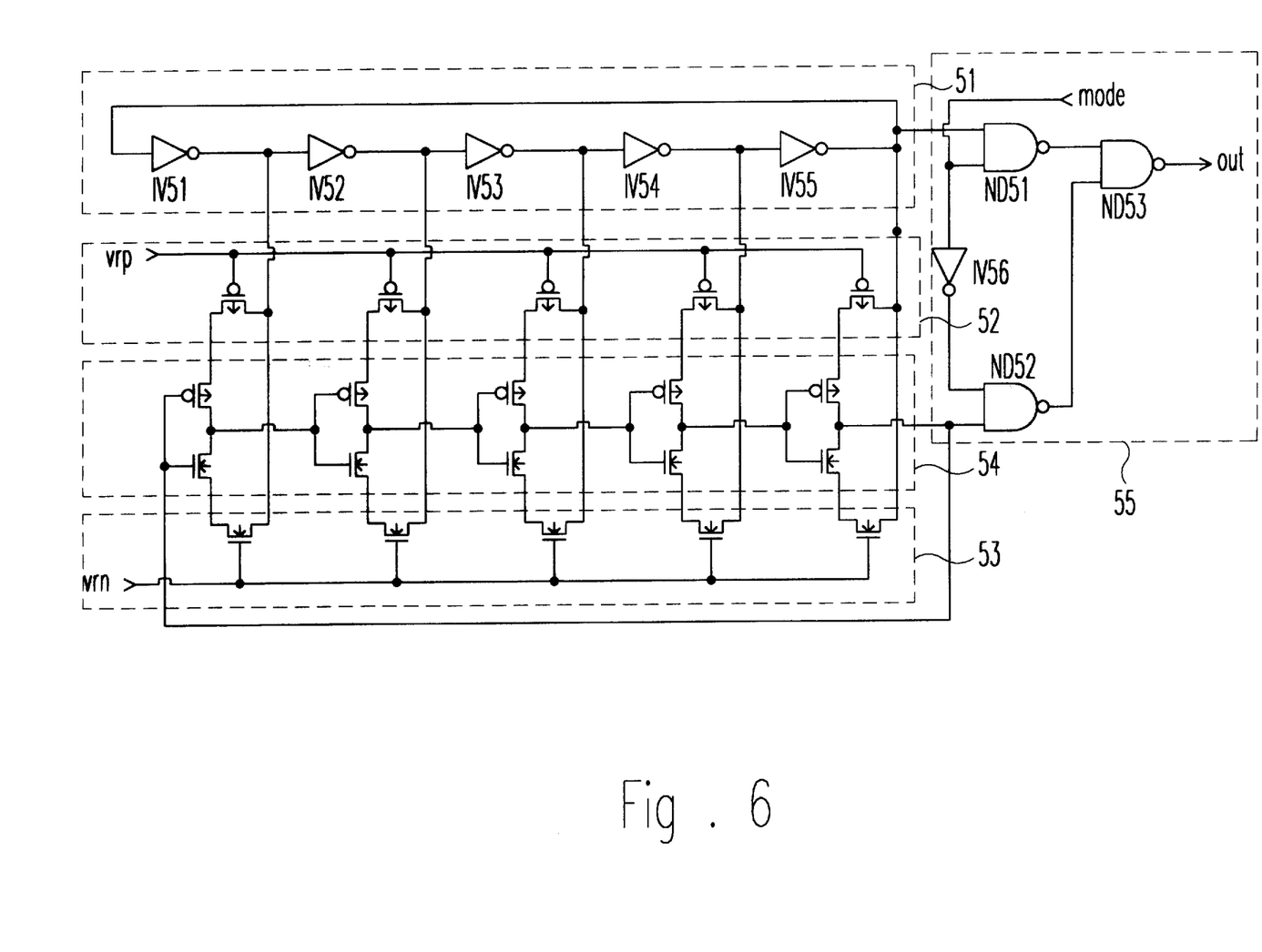
FIG. 6 is a circuit diagram of an oscillating device wherein reference potentials are added to the second preferred embodiment of th preset invention.

FIG. 6 is a circuit diagram of the oscillating device wherein reference potentials are added to the second preferred embodiment of the present invention.

In order to produce waveforms that do not vary with ambient voltage and temperature, the oscillating device includes a first voltage/temperature controller 52 that is connected between each source terminal of a second ring oscillator 54's PMOS transistors and each output terminal of first ring oscillator 51's inverters, and a second voltage/temperature controller 53 which is connected between each source terminal of second ring oscillator 54's NMOS transistors and each output terminal of first ring oscillator 51's inverters.

The operation of the oscillating device is the same as that of the second preferred embodiment, and thus a detailed description thereabout will be omitted. This oscillating device's output waveforms are the same as those depicted in FIG. 12, and each of the waveforms has a constant pulse width, which is different from the second preferred embodiment's output waveforms.

Figure 7:
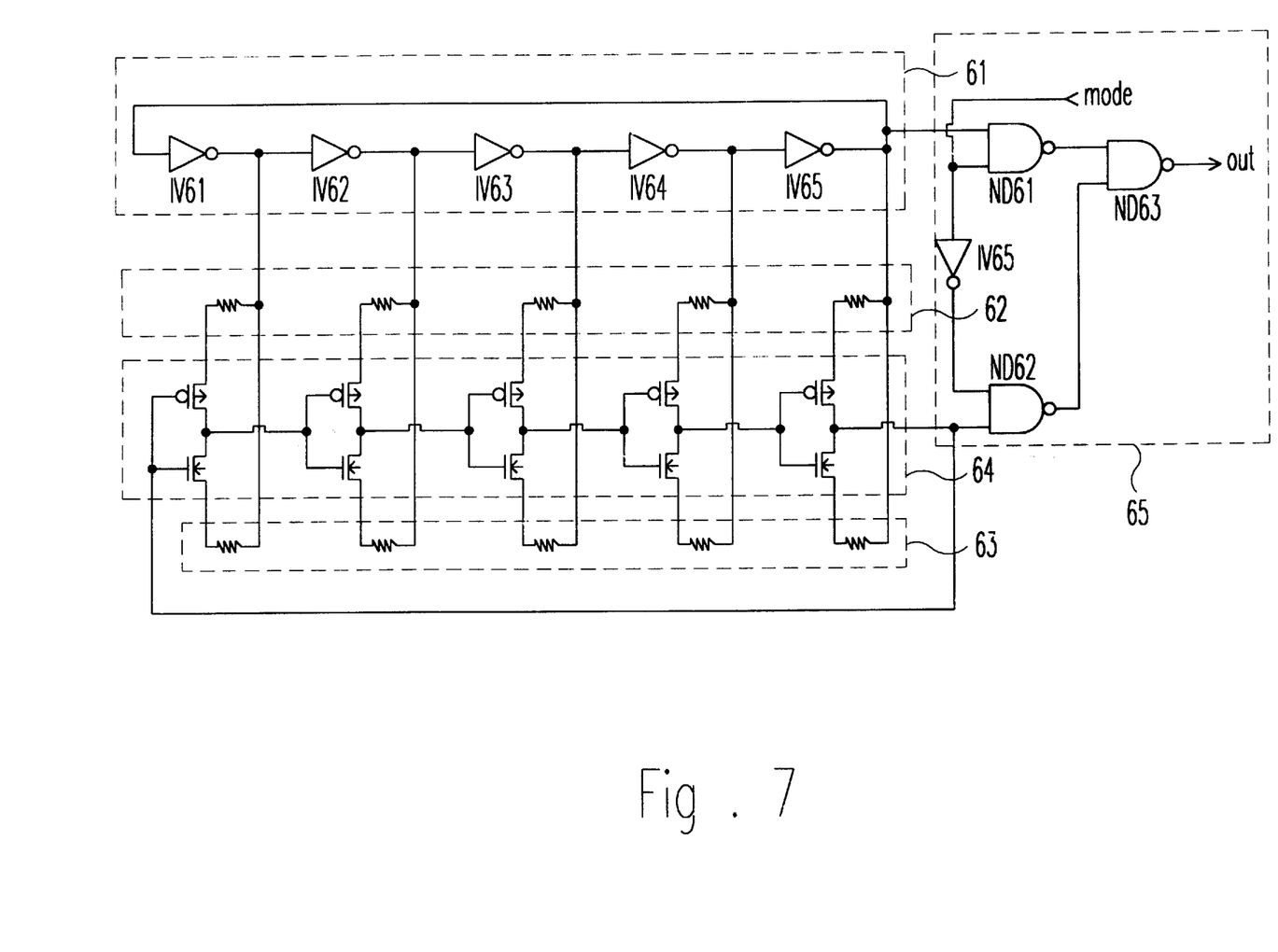
FIG. 7 is a circuit diagram of an oscillating device wherein resistors are added to the second preferred embodiment of the present invention.

FIG. 7 is a circuit diagram of an oscillating device wherein resistors are added to the second preferred embodiment of the present invention. The oscillating device has the same construction as that of the second preferred embodiment of the present invention, except that it has first and second temperature controllers 62 and 63, each consisting of the resistors that are. not influenced by the ambient temperature, and connected with voltage/temperature controllers.

Figure 8:
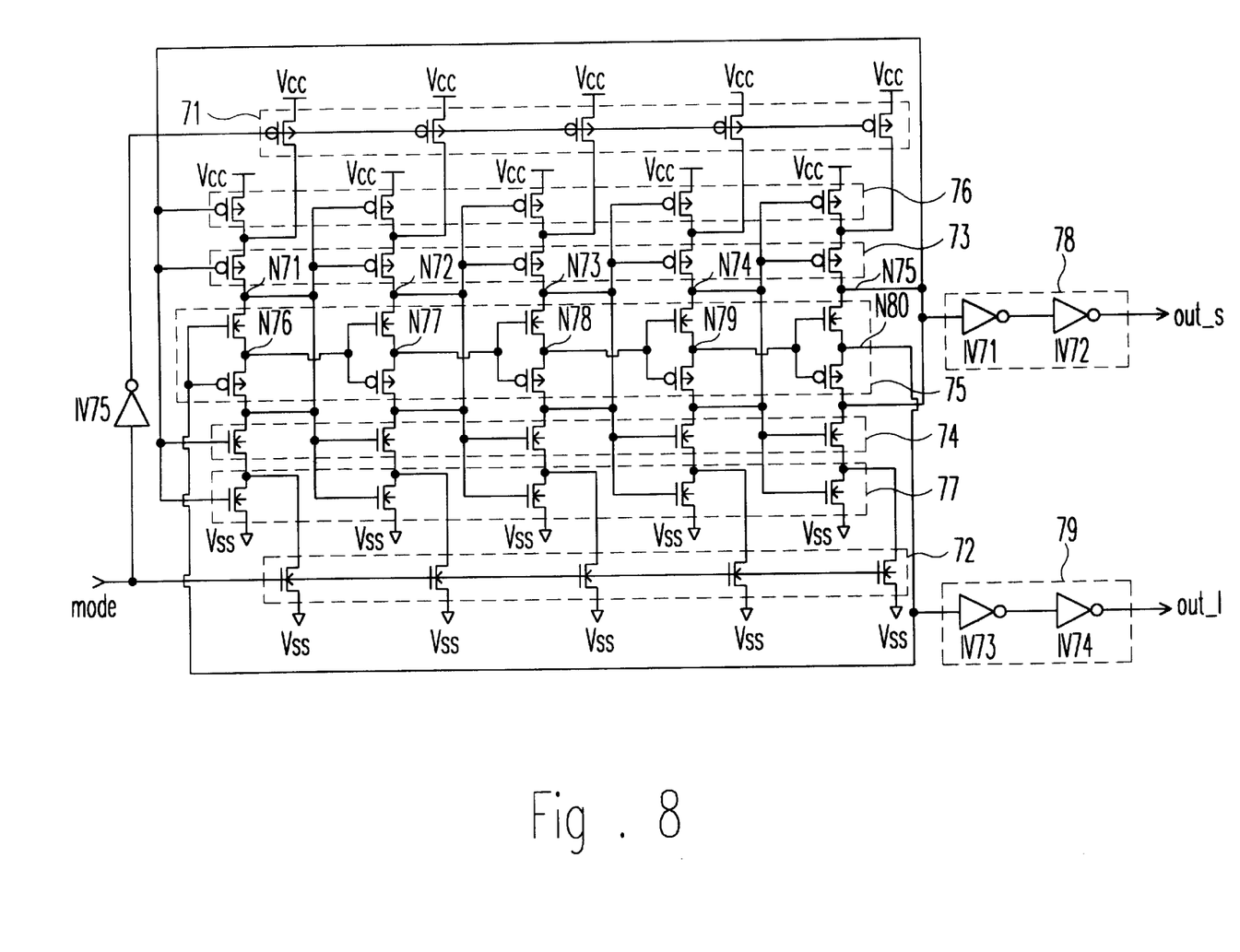
FIG. 8 is a circuit diagram of an oscillating device in accordance with a third preferred embodiment of the present invention.

FIG. 8 is a circuit diagram of an oscillating device in accordance with a third preferred embodiment of the present invention.

The oscillating device includes a first short-cycle output signal generator 71 that is connected between power supply Vcc and each drain terminal of a first long-cycle output signal generator 76's PMOS transistors, and has MOS transistors with gate terminals each receiving an inverted output of a mode signal, inverted by a 75th inverter IV75, and has a large turn-on size when the mode signal attains a high level, thus producing a short-cycle signal to a first output terminal; and a first-long-cycle output signal generator 76 that is connected between the power supply and each source terminal of a first transmission part 73's PMOS transistors, and has MOS transistors with gate terminals each receiving a signal that is sent to a drain terminal of first transmission part 73's preceding PMOS transistor, or a signal that is sent to a drain terminal of a second transmission part 74's preceding NMOS transistor, and then has the same turn-on size as that of each PMOS and NMOS transistor of second output signal generator 75 when the mode signal attains a low level, thereby producing a first long-cycle output signal.

The oscillating device includes first transmission part 73 that is connected between each drain terminal of first long-cycle output signal generator 76's PMOS transistors and each drain terminal of second output signal generator 75's NMOS transistor, and has MOS transistors with gate terminals each receiving a signal that is sent to a drain terminal of first transmission part 73's preceding PMOS transistor, or a signal that is sent to a drain terminal of second transmission part 74's preceding NMOS transistor, thus transmitting a signal, sent through first-short-cycle output signal generator 71 or first long-cycle output signal generator 76, to a gate terminal of first short-cycle output signal generator 76's next MOS transistor, each gate terminal of first transmission part 73's MOS transistors, and each drain terminal of second output signal generator 75's NMOS transistors and PMOS transistors, respectively; and second output signal generator 75 having five delays. Each delay consists of NMOS and PMOS transistors. Each of the NMOS transistors has a source terminal connected with a source terminal of the respective PMOS transistors, and a drain terminal connected with a drain terminal of each of the PMOS transistors of first transmission part 73. Each of the PMOS transistors has the drain terminal connected with the drain terminal of each NMOS transistor of first transmission part 73, and a gate terminal connected with the gate terminal of each NMOS transistor, and receiving the first delay's output signal. Nodes of each NMOS transistor's source terminal and each PMOS transistor's source terminal is connected with the next delay's gate terminal, thus producing a second output signal.

The oscillating device also includes second transmission part 74 that is connected between each drain terminal of first long-cycle output signal generator 76's PMOS transistors and each drain terminal of second output signal generator 75's NMOS transistors, and has MOS transistors with gate terminals each receiving a signal sent to a drain terminal of first transmission part 73's preceding PMOS transistor, or a signal sent to a drain terminal of second transmission part 74's preceding NMOS transistor, thus transmitting a signal, sent through first-short-cycle output signal generator 71 or first long-cycle output signal generator 76, to a gate terminal of first short-cycle output signal generator 76's next MOS transistor, each gate terminal of first transmission part 73's MOS transistors, and each drain terminal of second output signal generator 75's NMOS transistors and PMOS transistors, respectively.

The oscillating device further includes a first long-cycle output signal generator 77 that is connected between ground Vss and each source terminal of second transmission part 74's NMOS transistors, and has MOS transistors with gate terminals each receiving a signal sent to the drain terminal of first transmission part 73's preceding PMOS transistor, or a signal sent to the drain terminal of second transmission part 74's preceding NMOS transistor, and then has the same turn-on size as that of each PMOS and NMOS transistor of second output signal generator 75 when the mode signal attains a low level, thus producing a first long-cycle output signal; and a first-short-cycle output signal that is connected between ground Vss and each drain terminal of a first long-cycle output signal generator 77's NMOS transistors, has MOS transistors with gate terminals each receiving a mode signal, and has a large turn-on size when the mode signal attains a high level, thus producing a short-cycle signal to the first output terminal.

The operation of the oscillating device in accordance with the third preferred embodiment is described as follows.

Provided that a 75th node N75 and a 80th node N80 are respectively at low and high states when the mode signal is at a high level, MOS transistors of each of first short-cycle output signal generators 71 and 72 are turned on by the mode signal at the same time, and the power supply voltage is applied to each drain terminal of first long-cycle output signal generator 76's PMOS transistors while the ground voltage is applied to each drain terminal of first long-cycle output signal generator 77's NMOS transistors. The low-level signal at 75th node N75 is fed back to the first MOS transistor, and turns on transmission part 73's PMOS transistors to thereby transmit the power supply voltage at each drain terminal of first long-cycle output signal generator 76's PMOS transistors, to 71st node N71. The high-level signal at 80th node N80 is fed back to turn on second output signal generator 75's first NMOS transistor so that the high-level signal at 71st node N71 is transmitted to a 76th node N76. Since the turn-on size of each of second output signal generator 75's NMOS and PMOS transistors is relatively small compared to that of each of first short-cycle output signal generator 71's PMOS transistors, the high-level signal of 71th node N71 is not applied to 76th node N76 intact, and only a slight voltage rise occurs. Accordingly, 76th node N76 still remains low, and the low-level signal is applied to the next delay's common gate.

Consequently, 71th node N71 is at high level, and transmission part 74's NMOS transistors are turned on so that 72nd node N72 attains a low level by receiving the ground voltage. 77th node N77 attains as low a level as the PMOS transistor is turned on by the low-level signal of 76th node N76 and the low-level signal at 72nd node N72 is applied to 77th node N77. The potential at 77th node N77 is higher than 76th node N76's.

In the meantime, 72nd node N72 is at low state, and transmission part 73's PMOS transistor is turned on so that 73rd node N73 attains high level by receiving the power supply voltage. 78th node N78 receives the high-level signal of 73rd node N73 as the PMOS transistor is turned on by the low-level signal of 77th node N77. The turn-on size of the PMOS transistor is small so there is a voltage rise from a low level to a high level, and the PMOS transistor's output is considered to be at low level. 78th node N78's potential remains low, while being higher than 77th node N77's. That is, the potential at 78th node N78 is low and closer to high level. 74th node N74 is in a low state as delay part 74's NMOS transistor is turned on by 73rd node N73's high-level signal and 78th node N78's low-level signal and the ground voltage is applied to 74th node N74. A low-level signal is outputted from 79th node N79 to which the low-level signal of 74th node N74 is applied through the turned-on PMOS transistor. Similarly, 79th node N79's potential is higher than 78th node N78's. Transmission part 73's PMOS transistor of the last stage is turned on by the low-level signal of 74th node N74, and the power supply voltage is applied to 75th node N75, thus making 75th node N75 attain a high state. The high-level signal of 75th node N75 is sent to 80th node N80 through the PMOS transistor that is turned on by the low-level signal of 79th node N79, and the potential at 79th node N79 is close to high level even though the turn-on size of each of the delay's NMOS and PMOS transistors is small so that those NMOS and PMOS transistors are turned on and large current flows across the transistors. The low-level signal of 75th node N75 and the high-level signal of 80th node N80 are fed back to the first MOS transistor of both first transmission part 73 and second output signal generator 75, respectively, so that a high-level signal, an inverted output of the first low-level signal, is produced from 75th node N75, and the original high-level signal is produced from 80th node N80.

The high-level signal of 75th node N75 is fed back to the first MOS transistor of first transmission part 73, and the-highlevel signal of 80th node N80 is inputted to second output signal generator 75's first MOS transistor through the feedback line, thereby repeating the above operation.

Figure 13:
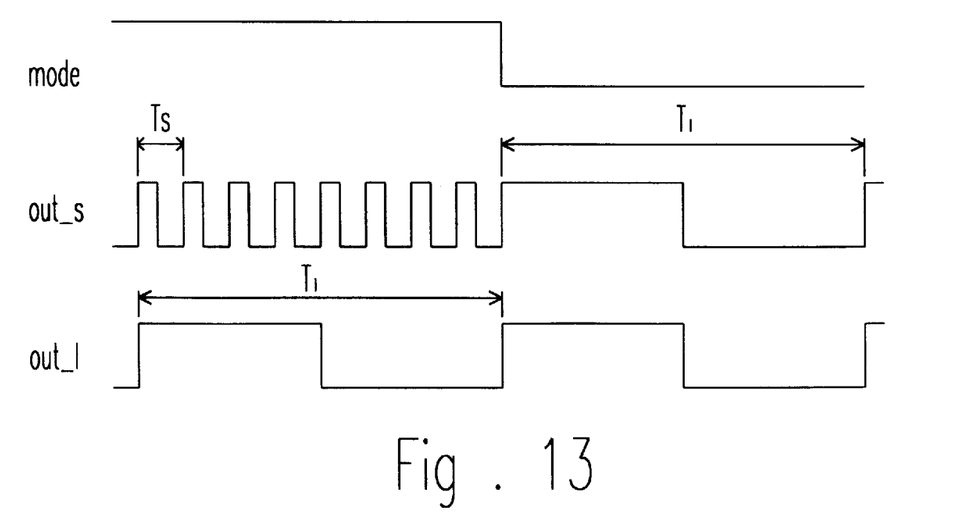
FIG. 13 is a timing diagram of output signals each having a different cycle first and then having the same cycle, produced from the oscillating device in accordance with the third preferred embodiment.

FIG. 13 is a timing diagram of output signals of FIG. 8's oscillating device, and depicts the waveforms produced from first output terminal Out-s and second output terminal Out-l, respectively, when the mode signal attains a high level and a low level.

When the mode signal attains a high level, one waveform, having a small pulse width and a short cycle and frequently changing from a low level to a high level and from a high level to a low level, is produced from first output terminal Out-s, and the other waveform having a large pulse width and a long cycle is output from second output terminal Out-l. The turn-on size of each of first short-cycle output signal generators 71 and 72's PMOS and NMOS transistors is larger than that of each of second output signal generator 75's MOS transistors, and large amounts of current flow across first short-cycle output signal generators 71 and 72, thus assuring rapid signal propagation. The turn-on size of each of second output signal generator 75's MOS transistors is small to thereby retard the change of potential at second output terminal Out-1.

When the mode signal attains a low level, the respective MOS transistors of first short-cycle output signal generators 71 and 72 are all turned off, and first long-cycle output signal generators 76 and 77 go into action. Each of first long-cycle output signal generators 76 and 77's PMOS and NMOS transistors has the same turn-on size as that of each of second output signal generator 75's PMOS and NMOS transistors. The oscillating device performs the same operation as that when the mode signal attains a high level, and a long-cycle signal is produced from first output terminal Out-s by first long-cycle output signal generators 76 and 77. Shortly, in the third preferred embodiment of the present invention, the oscillating device has two different output terminals, and when the mode signal is at high level, a short-cycle signal is produced from first output terminal Out-s by first short-cycle output signal generators 71 and 72. In addition, as the mode signal is at a low level, a-long-cycle signal is produced from first output terminal Out-s by first long-cycle output signal generators 76 and 77. A long-cycle signal is produced from second output terminal Out-1 when the mode signal attains a high or low level, which depends on the size of the respective MOS transistors.

Figure 9:
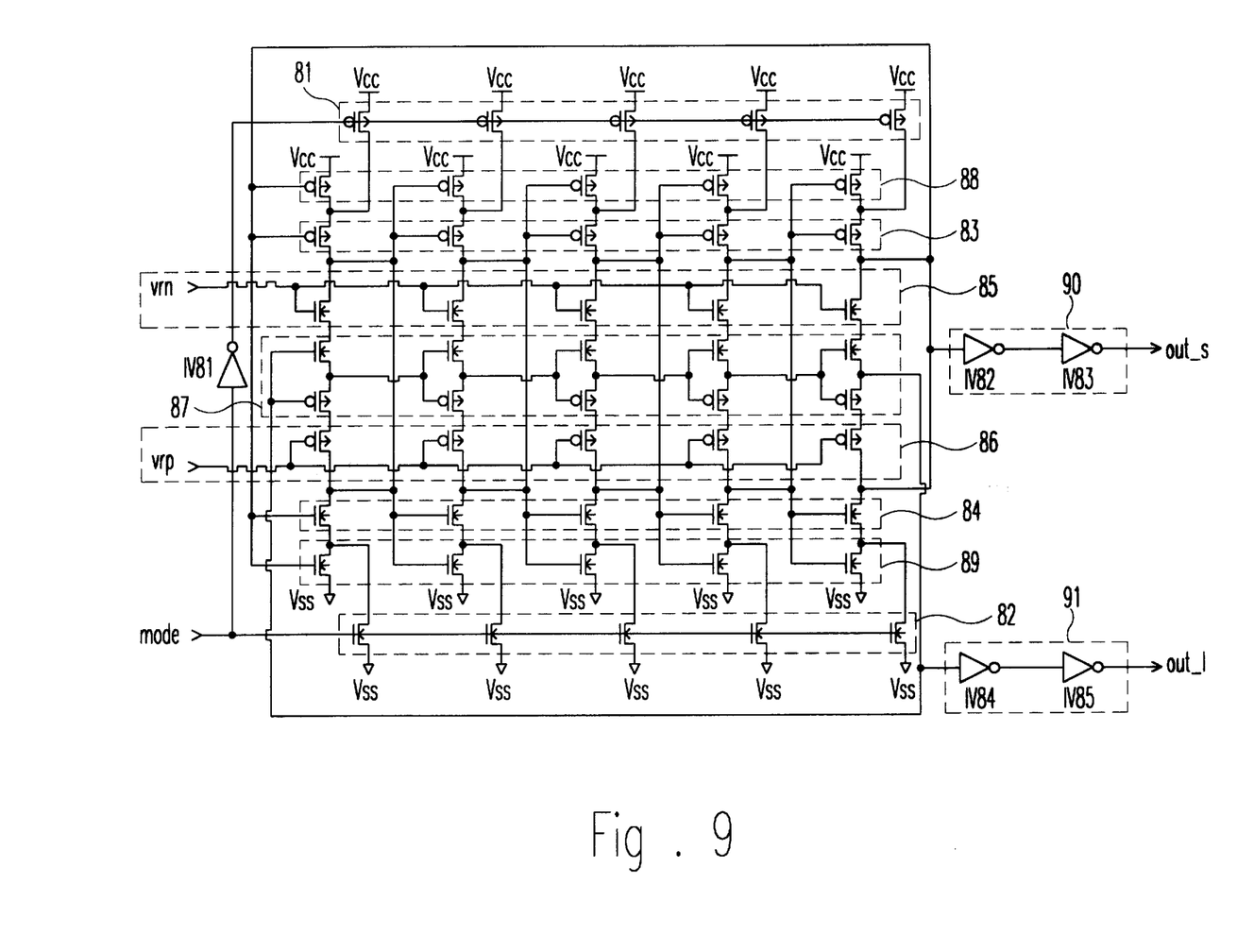
FIG. 9 is a circuit diagram of an oscillating device wherein reference potentials are added to the third preferred embodiment of the present invention.

FIG. 9 is a circuit diagram of an oscillating device wherein reference potentials are added to the third preferred embodiment of the present invention. The oscillating device of the third preferred embodiment further includes a first voltage/temperature controller 85 connected between each drain terminal of a transmission part 83's PMOS transistors and each drain terminal of a second output signal generator 87's NMOS transistors, and having MOS transistors with gate terminals to which reference potential vrn is applied, and a second voltage/temperature controller 86 connected between each drain terminal of second output signal generator 87's PMOS transistors and each drain terminal of a transmission part 84's NMOS transistors, and having MOS transistors with gate terminals to which reference potential vrp is applied.

This oscillating device performs the same operation as that of the third preferred embodiment's oscillating device, except that it generates a signal that does not vary with voltage and temperature. Therefore, a detailed description thereabout will be omitted.

Figure 10:
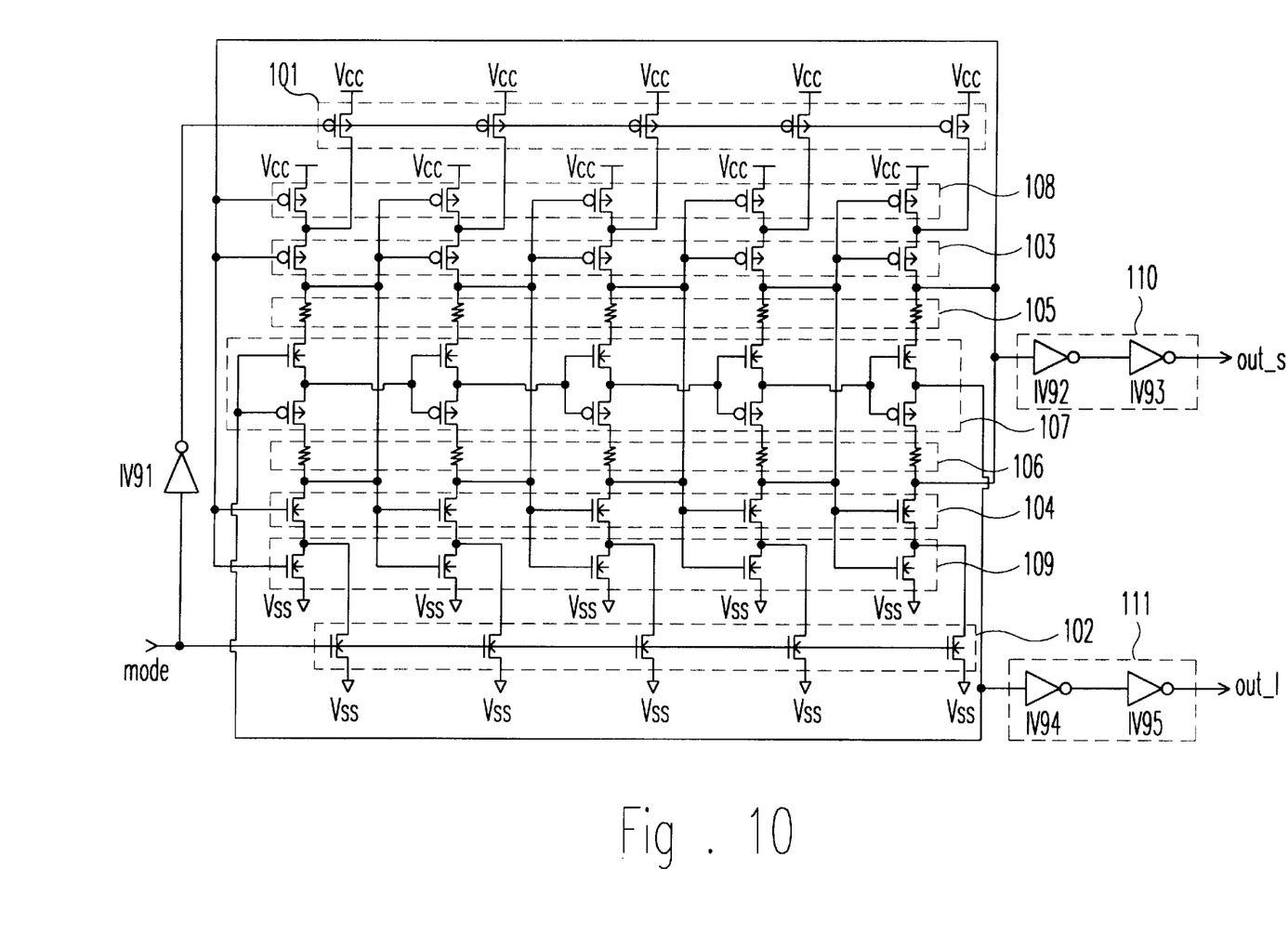
FIG. 10 circuit diagram of an oscillating device wherein resistors are added to the third preferred embodiment of the present invention.

FIG. 10 is a circuit diagram of an oscillating device wherein resistors are added to the third preferred embodiment of the present invention.

The oscillating device further includes a temperature controller 105 connected between each drain terminal of a transmission part 103's PMOS transistors and each drain terminal of a second output signal generator 107's NMOS transistors, and a second voltage/temperature controller 106 connected between each drain terminal of second output signal generator 107's PMOS transistors and each drain terminal of a transmission part 104's NMOS transistors.

Such an oscillating device performs the same operation as that of the third preferred embodiment's oscillating device, except that it generates a signal that does not vary with temperature.

Therefore, a detailed description thereabout will be omitted.

As the above-described preferred embodiments of the present invention are applied to an oscillating device, the oscillating device has a power saving function for decreasing power consumption without increasing the chip size, and generates signals of different cycles.

It will be apparent to those skilled in the art that various modifications and variations can be made in the oscillating device of the present invention without departing from the spirit or scope of the invention. Thus, it is intended that the present invention cover the modifications and variations of this invention provided they come within the scope of the appended claims and their equivalents.

What is claimed is:

1. An oscillating device comprising:

a first ring oscillator having at least three inverters connected in series, an input terminal of the first of the inverters being connected with an output terminal of the last of the inverters, and applying an output signal of the last inverter to a first buffer means' input terminal, thus producing a signal of first cycle;

the first buffer means connected with the output terminal of the first ring oscillator's last inverter, having at least two inverters connected in series, and buffering an output signal of the last inverter to produce it to outside;

a second ring oscillator having at least three delay means connected in series, wherein a power supply of each delay means is connected with the output terminal of each of the first ring oscillator's corresponding inverters, and an output terminal of the last of the delay means connected with an input terminal of the first of the delay means, thus producing a signal of second cycle which is larger than said first cycle and inputting to an input terminal of a second buffer means; and the second buffer means connected with the output terminal of the second ring oscillator's last delay means, having at least two inverters connected in series, and buffering an output signal of the last delay means.

2. An oscillating device according to claim 1, wherein each delay means has a PMOS transistor and an NMOS transistor, the PMOS transistor including a gate terminal connected with the NMOS transistor's gate terminal, being controlled by an output signal of the preceding one of the delay means; a source terminal connected with the NMOS transistor's source terminal and receiving an output terminal of each of the first ring oscillator's inverters; and a drain terminal connected with the NMOS transistor's drain terminal and producing a signal for controlling the next delay means' common gate terminal.

3. An oscillating device according to claim 1, further comprising:

another PMOS transistor connected between each source terminal of the delay means' PMOS transistors and each output terminal of the first ring oscillator's inverters, and each having a gate terminal to which a PMOS-reference potential is applied; and another NMOS transistor connected between each source terminal of the delay means' NMOS transistors and each output terminal of the first ring oscillator's inverters, and each having a gate terminal to which a NMOS-reference potential is applied.

4. An oscillating device according to claim 1, further comprising:

first resistors connected between each source terminal of the delay means' PMOS transistors and each output terminal of the first ring oscillator's inverters; and second resistors connected between each source terminal of the delay means' NMOS transistors and each output terminal of the first ring oscillator's inverters.

5. An oscillating device comprising:

a first ring oscillator having at least three inverters connected in series, an input terminal of the first of the inverters being connected with an output terminal of the last of the inverters, and producing a first-cycle output signal of the last inverter to one input terminal of output means;

a second ring oscillator having at least three delay devices connected in series, wherein a power supply of each delay device is connected with the output terminal of each of the first ring oscillator's corresponding inverters, and an output terminal of the last of the delay devices connected with an input terminal of the first of the delay devices, thus producing a signal of the second cycle to another input terminal of said output means; and said output means receiving the first-cycle output signal of the first ring oscillator and the second-cycle output signal of the second ring oscillator, thus producing an output signal of the first cycle when a mode signal attains a high level, and producing an output signal of the second cycle when the mode signal attains a low level.

6. An oscillating device according to claim 5, wherein each delay device comprise NMOS and PMOS transistors, of the respective delay devices, each PMOS transistor includes a gate terminal connected with each NMOS transistor's gate terminal forming a common gate terminal, being controlled by an output signal of the preceding delay device; a source terminal connected with the NMOS transistor's source terminal and receiving an output terminal of each of the first ring oscillator's inverters; and a drain terminal connected with the NMOS transistor's drain terminal and producing a signal for controlling the next delay device's common gate terminal.

7. An oscillating device according to claim 5, wherein said output means includes:

a first NAND gate performing a NAND operation with respect to the output signal of the first ring oscillator and the mode signal, and producing a resultant signal;

a second NAND gate performing a NAND operation with respect to an inverted output of the mode signal and an output signal of the second ring oscillator, and producing a resultant signal;

an inverter inverting the mode signal and producing an inverted output of the mode signal to one input terminal of the second NAND gate; and a third NAND gate performing a NAND operation with respect to the first NAND gate's output signal and the second NAND gate's output signal, and producing a resultant signal.

8. An oscillating device according to claim 5, further comprising:

another PMOS transistors connected between each source terminal of the delay devices' PMOS transistors and each output terminal of the first ring oscillator's inverters, and each having a gate terminal to which a PMOS-reference potential is applied; and another NMOS transistor connected between each source terminal of the delay devices' NMOS transistors and each output terminal of the first ring oscillator's inverters, and each having a gate terminal to which a NMOS-reference potential is applied.

9. An oscillating device according to claim 5, further comprising:

first resistors connected between each source terminal of the delay devices' PMOS transistors and each output terminal of the first ring oscillator's inverters; and second resistors connected between each source terminal of the delay devices' NMOS transistors and each output terminal of the first ring oscillator's inverters.

10. An oscillating device comprising:

first short-cycle output signal generating means including at least three MOS transistors, said MOS transistors each having a gate terminal receiving an inverted output of a mode signal when the mode signal attains a high level, and producing a short-cycle first output signal;

one first long-cycle output signal generating means including at least three MOS transistors, said MOS transistors each having a gate terminal receiving an output signal from a node of first transmission means and second output signal generating means or an output signal from a node of the second output signal generating means and second stage-front transmission means, and producing a long-cycle first output signal when the mode signal attains a high level;

the first transmission means connected between the first long-cycle output signal generating means and the second output signal generating means, and transmitting a power supply voltage sent by the first short-cycle output signal generating means and the first long-cycle output signal generating means, to the node of the second output signal generating means;

the second output signal generating means having at least three delay means connected between the first transmission means and second stage-front transmission means, and producing a second output signal;

the second stage-front transmission means connected between the second output signal generating means and the first long-cycle output signal generating means, and transmitting a ground voltage, transmitted by the first short-cycle output signal generating means or the first long-cycle output signal generating means, to the node of the second output signal generating means;

the other first long-cycle output signal generating means having at least three MOS transistors connected between the second transmission means and first short-cycle output signal generating means, and producing a first signal of long cycle when the mode signal attains a low level; and the first short-cycle output signal generating means having at least three odd MOS transistors each having a gate terminal receiving the mode signal when the mode signal is at high level, and producing a first signal of short cycle.

11. An oscillating device according to claim 10, wherein the MOS transistors of the first short-cycle output signal generating means are each PMOS transistors connected between the power supply and a node of the first short-cycle output signal generating means and the first transmission means.

12. An oscillating device according to claim 10, wherein the first long-cycle output signal generating means includes MOS transistors each having a gate terminal receiving an output signal from the node of the first transmission means and the second output signal generating means or an output signal from the node of the second output signal generating means and the second transmission means, thus producing the power supply voltage to the first transmission means.

13. An oscillating device according to claim 10, wherein the first transmission means includes MOS transistors each having a gate terminal receiving the output signal from the node of the first transmission means and the second output signal generating means or the output signal from the node of the second output signal generating means and the second transmission means, and is connected between the first long-cycle output signal generating means and the second output signal generating means.

14. An oscillating device according to claim 10, wherein each delay means includes a PMOS transistor and a NMOS transistor, the PMOS transistor including a gate terminal connected with the NMOS transistor's gate terminal, being controlled by an output signal of the MOS transistor at the previous stage; a source terminal connected with the NMOS transistor's source terminal, and controlling the next MOS transistor's common gate terminal; and a drain terminal connected with a drain terminal of each of the second transmission means' NMOS transistors, a drain terminal of each of said delay means' NMOS transistors being connected with a drain terminal of the first transmission means' PMOS transistors.

15. An oscillating device according to claim 10, wherein the second transmission means includes MOS transistors each having a gate terminal receiving the output signal from the node of the first transmission means and the second output signal generating means or the output signal from the node of the second output signal generating means and the second transmission means, and is connected between each drain terminal of the second output signal generating means' PMOS transistors and one terminal of each of the first long-cycle output signal generating means's MOS transistors.

16. An oscillating device according to claim 10, wherein the first long-cycle output signal generating means includes MOS transistors each having a gate terminal receiving the output signal from the node of the first transmission means and the second output signal generating means or the output signal from the node of the second output signal generating means and the second transmission means, and is connected between each source terminal of the first long-cycle output signal generating means' NMOS transistors and ground voltage.

17. An oscillating device according to claim 10, wherein the first short-cycle output signal generating means' MOS transistors are connected between the ground voltage and a node of the second transmission means and the first long-cycle output signal generating means.

18. An oscillating device according to claim 10, further comprising:

NMOS transistors each having a gate terminal receiving-NMOS-reference potential, and connected between each drain terminal of the first transmission means' PMOS transistors and each drain terminal of the second output signal generating means' NMOS transistors; and PMOS transistors each having a gate terminal receiving-PMOS-reference potential, and connected between each drain terminal of the second output signal generating means' PMOS transistors and each drain terminal of the second transmission means' NMOS transistors.

19. An oscillating device according to claim 10, further comprising:

first resistors connected between each drain terminal of the first transmission means' PMOS transistors and each drain terminal of the second output signal generating means' NMOS transistors; and second resistors connected between each drain terminal of the second output signal generating means' PMOS transistors and each drain terminal of the second transmission means' NMOS transistors.

* * * * *